United States Patent
Chiba et al.

(10) Patent No.: US 9,653,555 B2
(45) Date of Patent: May 16, 2017

(54) DEPRESSION FILLING METHOD AND PROCESSING APPARATUS

(71) Applicant: TOKYO ELECTRON LIMITED, Tokyo (JP)

(72) Inventors: Youichirou Chiba, Nirasaki (JP); Takumi Yamada, Nirasaki (JP); Daisuke Suzuki, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/041,144

(22) Filed: Feb. 11, 2016

(65) Prior Publication Data

US 2016/0240618 A1  Aug. 18, 2016

(30) Foreign Application Priority Data

Feb. 18, 2015  (JP) .................................. 2015-029732

(51) Int. Cl.

| | |
|---|---|
| *H01L 21/20* | (2006.01) |
| *H01L 29/40* | (2006.01) |
| *H01L 21/3205* | (2006.01) |
| *H01L 21/3213* | (2006.01) |
| *H01L 21/3215* | (2006.01) |

(52) U.S. Cl.
CPC ...... *H01L 29/401* (2013.01); *H01L 21/32055* (2013.01); *H01L 21/32135* (2013.01); *H01L 21/32155* (2013.01)

(58) Field of Classification Search
CPC ......... H01L 21/32055; H01L 21/32135; H01L 21/32155; H01L 29/401
See application file for complete search history.

(56) References Cited

U.S. PATENT DOCUMENTS

2015/0187643 A1* 7/2015 Kakimoto ......... H01L 21/28531
438/607

FOREIGN PATENT DOCUMENTS

JP  2014-229857 A  12/2014

* cited by examiner

*Primary Examiner* — Daniel Shook
(74) *Attorney, Agent, or Firm* — Nath, Goldberg & Meyer; Jerald L. Meyer

(57) ABSTRACT

A method of filling a depression of a workpiece is provided. The depression passes through an insulating film and extends up to an inside of a semiconductor substrate. The method includes forming a first thin film made of a semiconductor material along a wall surface which defines the depression, performing gas phase doping on the first thin film, by annealing the workpiece within a vessel, forming an epitaxial region from the semiconductor material of the first thin film along a surface of the semiconductor substrate which defines the depression, without moving the first thin film with the gas phase doping performed, forming a second thin film made of a semiconductor material along the wall surface which defines the depression; and by annealing the workpiece within the vessel, further forming an epitaxial region from the semiconductor material of the second thin film moved toward a bottom of the depression.

5 Claims, 5 Drawing Sheets

DEPRESSION FILLING METHOD AND PROCESSING APPARATUS

CROSS-REFERENCE TO RELATED APPLICATION

This application claims the benefit of Japanese Patent Application No. 2015-029732, filed on Feb. 18, 2015, in the Japan Patent Office, the disclosure of which is incorporated herein in its entirety by reference.

TECHNICAL FIELD

The present disclosure relates to a depression filling method and a processing apparatus.

BACKGROUND

In the manufacture of a semiconductor device, a process of filling a semiconductor material such as silicon or the like into a depression such as a hole or a trench formed on a surface of a semiconductor wafer may be performed. The semiconductor wafer includes a semiconductor substrate and an insulating film formed on the semiconductor substrate. The depression is formed in the surface of the insulating film (the surface of the semiconductor wafer). The semiconductor material filled into the depression is the same as the material of the semiconductor substrate and is often used as, e.g., an electrode.

In the related art, there is known a method and apparatus for filling a depression formed in an insulating film of a workpiece which is a semiconductor wafer. The depression filling method includes a step of forming a first amorphous silicon film containing an impurity along a wall surface which defines a depression, a step of forming a second amorphous silicon film on the first amorphous silicon film, and a step of annealing the workpiece after the second amorphous silicon film is formed.

A depression provided on a surface of a semiconductor wafer may be formed so as to pass through the insulating film and extend up to an inside portion of a semiconductor substrate which serves as a base of the insulating film. This depression is formed by etching the insulating film and the semiconductor substrate. The present inventors have been studying a technique in which a depression is filled by moving a semiconductor material toward the bottom portion of the depression and forming an epitaxial region conforming to crystals of a semiconductor substrate from the semiconductor material. In this study, the present inventors have found that in a method of filling a depression by virtue of solid-phase epitaxial growth, when a region in which epitaxial growth is not performed is included in the inner wall surface of the depression, epitaxial growth is not performed in that region. As a result, the filling by an epitaxial region is not sufficiently performed in the depression and cavities may be partially formed in the depression. Accordingly, in the technique of filling the depression by virtue of the epitaxial growth of the semiconductor material, there is a need to suppress the formation of cavities within the depression.

SUMMARY

According to one embodiment of the present disclosure, a method of filling a depression of a workpiece which includes a semiconductor substrate and an insulating film formed on the semiconductor substrate, the depression passing through the insulating film and extending up to an inside of the semiconductor substrate, includes forming a first thin film made of a semiconductor material along a wall surface which defines the depression, performing gas phase doping on the first thin film, by annealing the workpiece within a vessel, forming an epitaxial region conforming to crystals of the semiconductor substrate from the semiconductor material of the first thin film along a surface of the semiconductor substrate which defines the depression, without moving the first thin film with the gas phase doping performed, forming a second thin film made of a semiconductor material along the wall surface which defines the depression; and by annealing the workpiece within the vessel, further forming an epitaxial region from the semiconductor material of the second thin film moved toward a bottom of the depression.

According to another embodiment of the present disclosure, a processing apparatus includes a vessel, a gas supply part configured to supply a first gas for forming a first thin film made of a semiconductor material, a second gas for forming a second thin film made of a semiconductor material and a third gas for use in gas phase doping, into the vessel, a heating device configured to heat an internal space of the vessel, and a control part configured to control the gas supply part and the heating device, wherein the control part is configured to execute a first control which causes the gas supply part to supply the first gas into the vessel, a second control which causes the gas supply part to supply the third gas into the vessel after the first control is executed, a third control which causes the heating device to heat the internal space of the vessel after the second control is executed, a fourth control which causes the gas supply part to supply the second gas into the vessel after the third control is executed, and a fifth control which causes the heating device to heat the internal space of the vessel after the fourth control is executed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
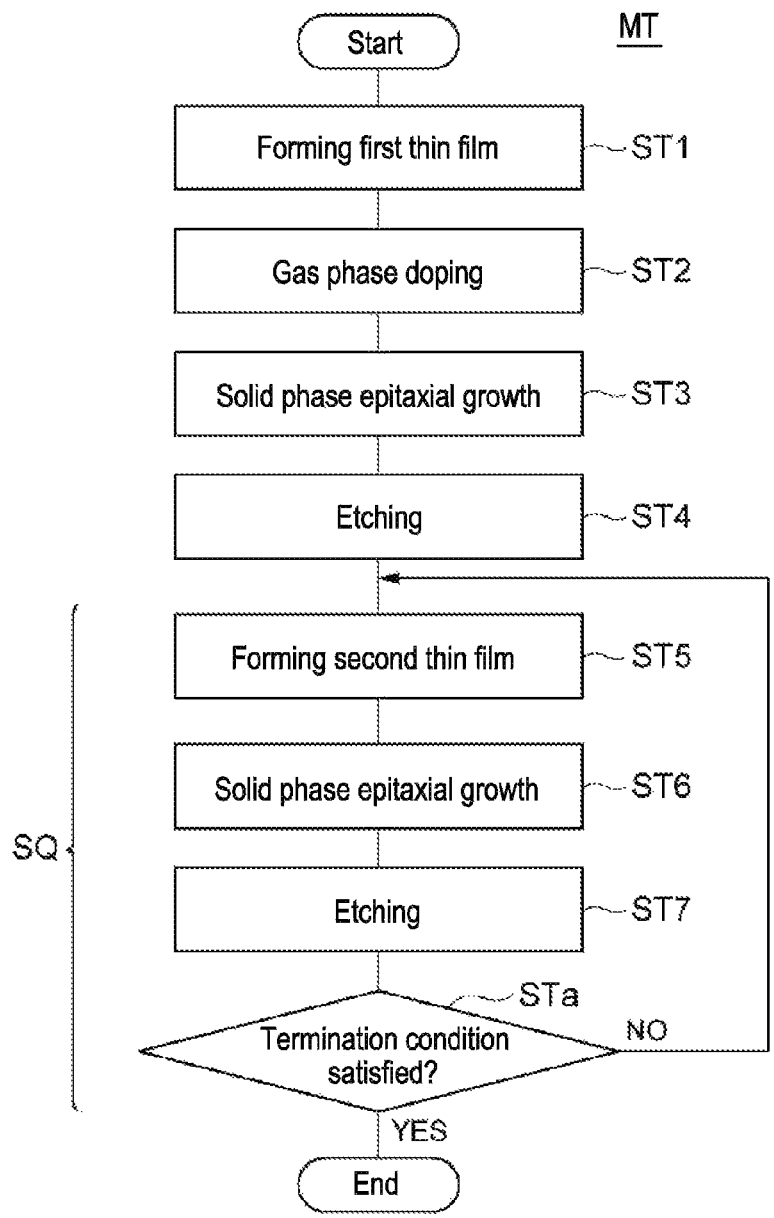
FIG. 1 is a flowchart illustrating a depression filling method according to an embodiment.

FIG. 1 is a flowchart illustrating a depression filling method according to an embodiment. FIGS. 2A to 2D are sectional views illustrating an initial state of a workpiece which is not subjected to the method illustrated in FIG. 1 and states of the workpiece which has been subjected to respective steps of the method illustrated in FIG. 1. FIGS. 3A to 3D are sectional views illustrating states of the workpiece which has been subjected to respective steps of the method illustrated in FIG. 1. The method MT illustrated in FIG. 1 is used to cause a semiconductor material to epitaxially grow within a depression of the workpiece, thereby filling the depression.

In an initial state before the application of the method MT, a workpiece (hereinafter often referred to as a "wafer W") has a configuration illustrated in FIG. 2A. That is to say, the wafer W includes a semiconductor substrate SB and an insulating film IF. The semiconductor substrate SB may be a monocrystalline semiconductor substrate or a polycrystalline semiconductor substrate, e.g., a monocrystalline silicon substrate or a polycrystalline silicon substrate. The insulating film IF is formed on the semiconductor substrate SB. The insulating film IF has a top surface TW. The insulating film IF may be formed of, e.g., silicon oxide ($SiO_2$) or silicon nitride ($Si_3N_4$).

A depression DR such as a trench or a hole (a contact hole, etc.) is formed in the wafer W. The depression DR is formed to pass through the insulating film IF from the top surface TW in a film thickness direction and also extend up to an inside of the semiconductor substrate SB. The depression DR may have a depth of, e.g., about 190 nm to 210 nm, and a width of, e.g., about 40 nm to 50 nm. The depression DR is defined by a side wall surface SW and a bottom surface BW. The side wall surface SW defines the depression DR at the lateral side. The bottom surface BW defines the depression DR at the lower side. The side wall surface SW includes a surface DS. The surface DS defines the depression DR at the lateral side in the semiconductor substrate SB. The depression DR may be formed by forming a mask on the insulating film IF, and etching the insulating film IF and the semiconductor substrate SB. By virtue of the etching, a region having damage, namely a damage region DM, may be generated on the surface DS which defines the depression DR of the semiconductor substrate SB. The damage region DM is a region (a region where epitaxial growth does not occur) which has a state different from the state of another region of the surface DS (the region where epitaxial growth occurs). The damage region DM may be formed when a component (e.g., carbon) contained in an etching gas is left without being removed. The damage region DM may be any region where epitaxial growth does not occur. The damage region DM may not be limited to the region attributable to the damage generated in an etching process and may be a region formed of a material different from the material of the semiconductor substrate SB.

In the method MT, steps ST1, ST2, ST3, ST5 and ST6 are carried out with respect to the wafer W illustrated in FIG. 2A. In some embodiments, a sequence SQ including steps ST5 and ST6 may be repeated. In some embodiments, one or more of steps ST4 and ST7 may be further carried out. Step ST7 is included in the sequence SQ.

An embodiment of a processing apparatus that can be used in implementing the method MT will be described.

Figure 4:
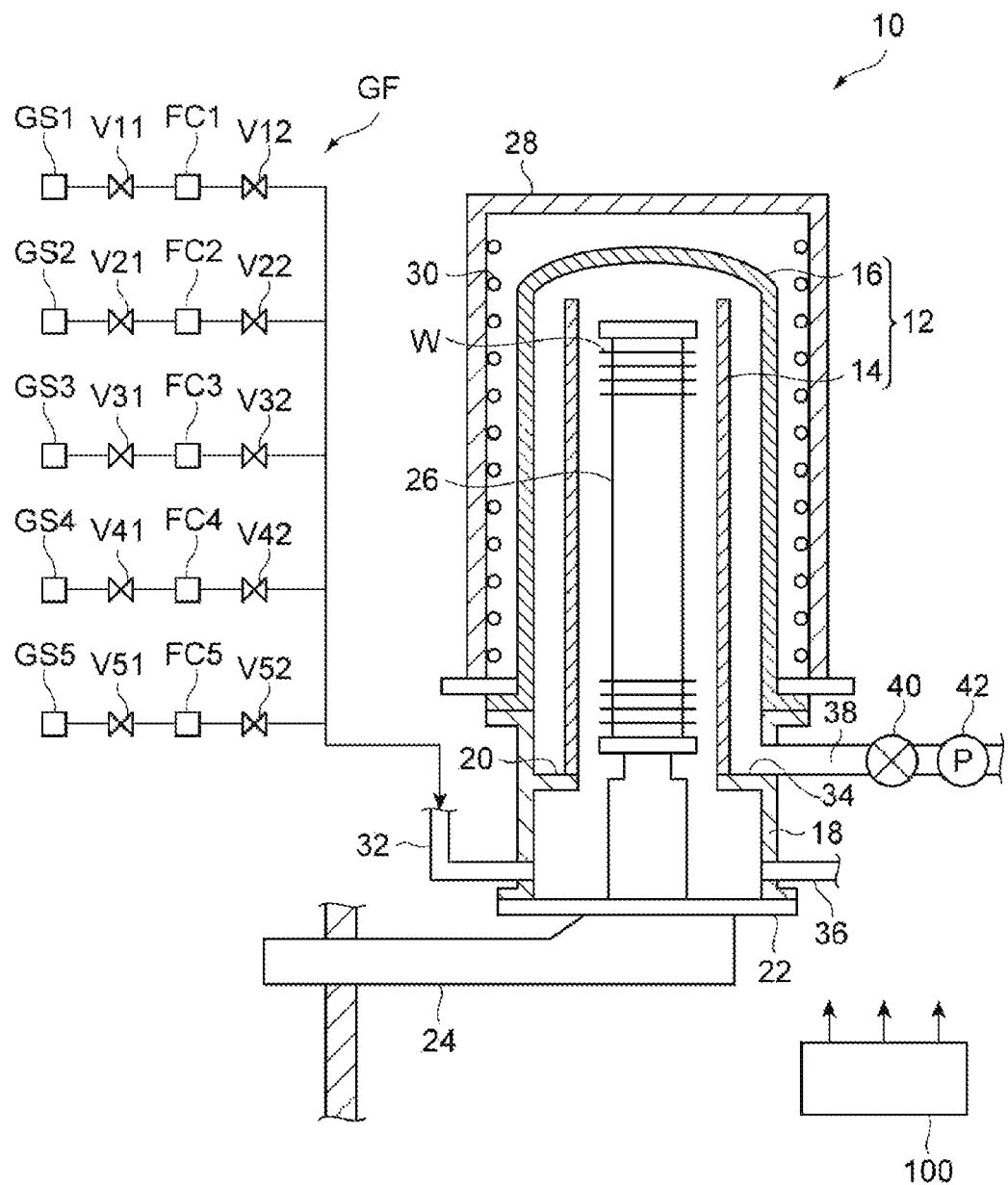
FIG. 4 is an illustrative view schematically showing a processing apparatus that can be used in implementing the method illustrated in FIG. 1.

FIG. 4 is a view schematically showing the processing apparatus that can be used in implementing the method illustrated in FIG. 1. The processing apparatus 10 shown in FIG. 4 includes a vessel 12, an inner tube 14, an outer tube 16, a manifold 18, a support ring 20, a lid 22, a boat elevator 24, a wafer boat 26, a heat insulating body 28, heaters 30, a gas introduction pipe 32, an exhaust port 34, a purge gas supply pipe 36, an exhaust pipe 38, a valve 40, an exhaust device 42, a control part 100 and a gas supply part GF.

The vessel 12 has a double tube structure and includes the inner tube 14 and the outer tube 16. The vessel 12 is a reaction tube having a substantially cylindrical shape. The longitudinal direction of the vessel 12 is oriented in a vertical direction. The inner tube 14 and the outer tube 16 are made of a material having an excellent property in heat resistance and corrosion resistance, e.g., quartz.

The inner tube 14 has a substantially cylindrical shape. The inner tube 14 includes an upper end and a lower end. The upper and lower ends of the inner tube 14 are opened. The outer tube 16 is installed in a substantially coaxial relationship with the inner tube 14 so as to cover the inner tube 14. The inner tube 14 and the outer tube 16 are formed to be spaced apart from each other at a constant distance. An upper end of the outer tube 16 is closed and a lower end of the outer tube 16 is opened.

The manifold 18 is installed below the outer tube 16. The manifold 18 is formed in a tubular shape and may be made of, e.g., stainless steel (SUS). The manifold 18 is air-tightly connected to the lower end of the outer tube 16. The support ring 20 is integrally formed on the inner wall of the manifold 18. The support ring 20 protrudes inward from the inner wall of the manifold 18. The support ring 20 supports the inner tube 14.

The lid 22 is installed below the manifold 18. The lid 22 is connected to the boat elevator 24 and can be moved up and down by the boat elevator 24. When the lid 22 is moved up by the boat elevator 24, a lower opening (namely, a throat portion) of the manifold 18 is closed. When the lid 22 is moved down by the boat elevator 24, the lower opening (namely, the throat portion) of the manifold 18 is opened.

The wafer boat 26 is mounted on the lid 22. The wafer boat 26 may be made of, e.g., quartz. The wafer boat 26 is configured to support a plurality of wafers W with a pre-specified gap left between the respective wafers in the vertical direction.

The heat insulating body 28 is installed around the vessel 12 so as to surround the vessel 12. The heaters (or a heating device) 30 are installed on the inner wall surface of the heat insulating body 28. The heaters 30 are composed of, e.g., resistance heating elements. The internal space of the vessel 12 is heated to a specified temperature by the heaters 30. Thus, the wafers W accommodated in the internal space of the vessel 12 are heated.

At least one gas introduction pipe 32 is connected to the side surface of the manifold 18. For example, the gas introduction pipe 32 is connected to the side surface of the manifold 18 at a position lower than the support ring 20. A gas line configured by the gas introduction pipe 32 communicates with the interior of the vessel 12.

The gas supply part GF is connected to the gas introduction pipe 32. In some embodiments, the gas supply part GF includes gas sources GS1, GS2, GS3, GS4 and GS5, valves V11, V12, V21, V22, V31, V32, V41, V42, V51 and V52, and flow rate controllers FC1, FC2, FC3, FC4 and FC5 such as mass flow controllers or the like. The gas source GS1 is connected to the gas introduction pipe 32 through the valve V11, the flow rate controller FC1 and the valve V12. The gas source GS2 is connected to the gas introduction pipe 32 through the valve V21, the flow rate controller FC2 and the valve V22. The gas source GS3 is connected to the gas introduction pipe 32 through the valve V31, the flow rate controller FC3 and the valve V32. The gas source GS4 is connected to the gas introduction pipe 32 through the valve V41, the flow rate controller FC4 and the valve V42. The gas source GS5 is connected to the gas introduction pipe 32 through the valve V51, the flow rate controller FC5 and the valve V52.

The gas supply part GF is configured to supply a first gas for forming a first thin film TF1 made of a semiconductor material, a second gas for forming a second thin film TF2 made of a semiconductor material, and a third gas used in gas phase doping, into the vessel 12. Furthermore, the gas supply part GF is configured to supply a fourth gas for etching the first thin film TF1 into the vessel 12 and is configured to supply a fifth gas for etching the second thin film TF2 into the vessel 12. The first gas is used at step ST1 which will be described later. The second gas is used at step ST5 which will be described later. The third gas is used in the gas phase doping of step ST2 which will be described later. The fourth gas is used at step ST4 which will be described later. The fifth gas is used at step ST7 which will be described later.

The gas source GS1 is a source of a raw material gas included in the first gas and the second gas. The gas source GS1 may be a source of a silicon-containing gas, a germanium-containing gas or a mixed gas of a silicon-containing gas and a germanium-containing gas. Specifically, the gas source GS1 is a source of a silicon-containing gas when a thin film formed at step ST1 and step ST5 is composed of silicon. The silicon-containing gas may be a monosilane gas, a disilane gas or an aminosilane-based gas. The gas source GS1 is a source of a germanium-containing gas such as a mono-germanium gas or the like when a thin film formed at step ST1 and step ST5 is composed of germanium. The gas source GS1 may be a source of a mixed gas of a silicon-containing gas and a germanium-containing gas when a thin film formed at step ST1 and step ST5 is composed of silicon and germanium.

The gas source GS2 is a source of an impurity source gas which is the third gas. Examples of the impurity may include arsenic (As), boron (B) and phosphorus (P). Examples of the impurity source gas may include phosphine ($PH_3$), diborane ($B_2H_6$), boron trichloride ($BCl_3$) and arsine ($AsH_3$).

The gas source GS3 is a source of an additive gas. Examples of the additive gas may include a $C_2H_4$ gas, a $N_2O$ gas, a NO gas and a $NH_3$ gas. In some embodiments, one or more of the $C_2H_4$ gas, the $N_2O$ gas, the NO gas and the $NH_3$ gas may be used as the additive gas.

The gas source GS4 is a source of an inert gas that can be used in annealing. Examples of the inert gas may include a hydrogen gas ($H_2$ gas) and a nitrogen gas ($N_2$ gas).

The gas source GS5 is a source of an etching gas which is included in the fourth gas used at step ST4 and the fifth gas used at step ST7. As the etching gas, it is possible to use a gas containing one or more of $Cl_2$, HCl, $F_2$, $Br_2$ and HBr. An arbitrary gas may be used as the etching gas as long as it can selectively etch the first thin film TF1 and the second thin film TF2 with respect to the insulating film IF and the epitaxial region EPR.

As shown in FIG. 4, an exhaust port 34 through which a gas existing within the vessel 12 is exhausted, is formed in the side surface of the manifold 18. The exhaust port 34 is arranged above the support ring 20 and is in communication with the space formed between the inner tube 14 and the outer tube 16 of the vessel 12. Accordingly, an exhaust gas generated within the inner tube 14 flows toward the exhaust port 34 through the space formed between the inner tube 14 and the outer tube 16.

The purge gas supply pipe 36 is connected to the manifold 18. The purge gas supply pipe 36 is connected to the manifold 18 below the exhaust port 34. The purge gas supply pipe 36 is connected to a purge gas supply source (not shown). A purge gas, e.g., a nitrogen gas, is supplied from the purge gas supply source into the vessel 12 through the purge gas supply pipe 36.

An exhaust pipe 38 is air-tightly connected to the exhaust port 34. The valve 40 and the exhaust device 42 such as a vacuum pump or the like are sequentially installed in the exhaust pipe 38 from the upstream side of the exhaust pipe 38. The valve 40 is configured to adjust an opening degree of the exhaust pipe 38, thereby controlling an internal pressure of the vessel 12 at a predetermined pressure. The exhaust device 42 is a device for depressurizing the internal space of the vessel 12. The exhaust device 42 discharges a gas from the vessel 12 through the exhaust pipe 38 and adjusts the internal pressure of the vessel 12. In some embodiments, a trap, a scrubber, and so forth may be installed in the exhaust pipe 38, and the processing apparatus 10 may be configured to detoxify the exhaust gas discharged from the vessel 12 before the exhaust gas is exhausted out of the processing apparatus 10.

Figure 5:
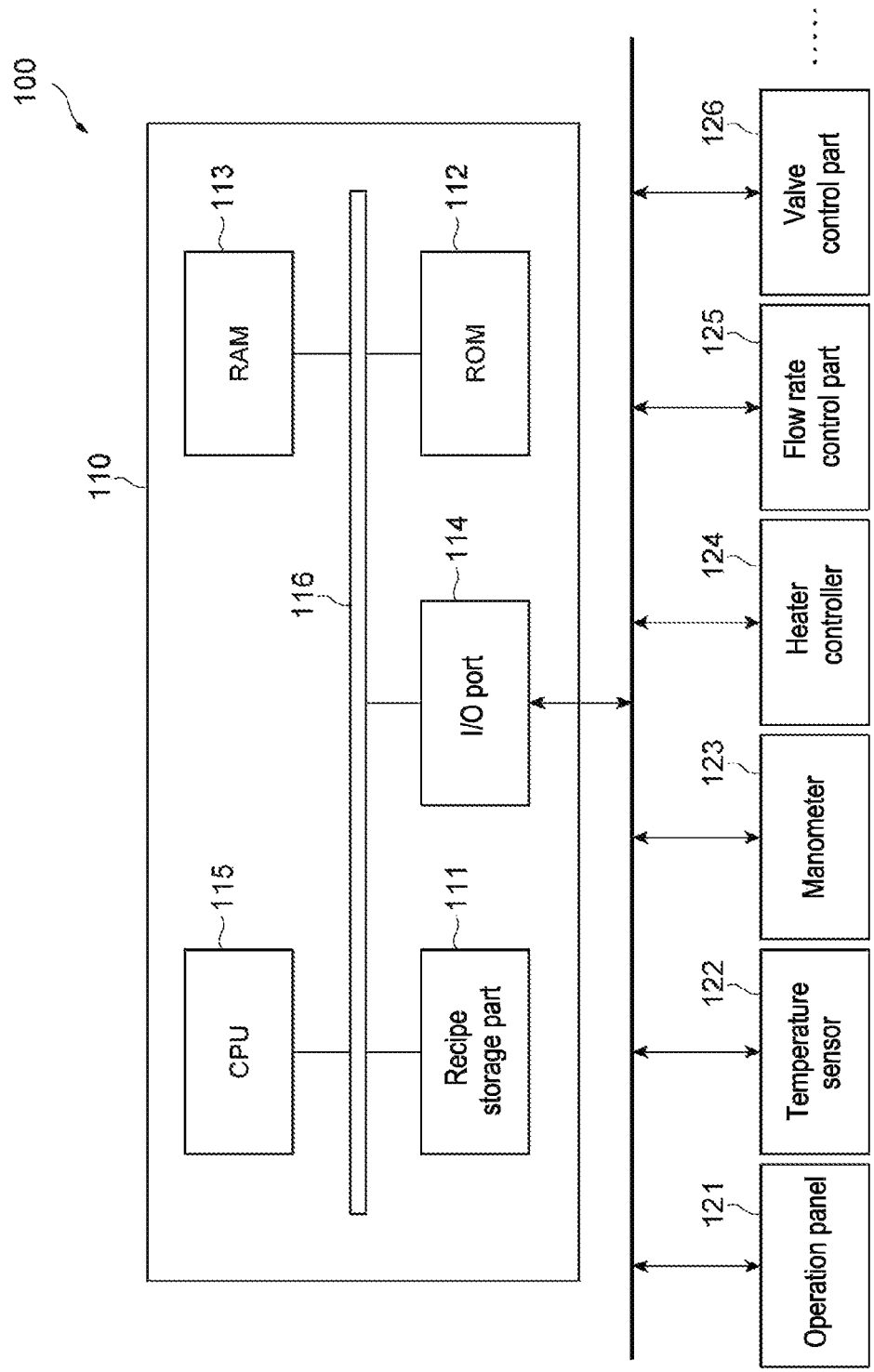
FIG. 5 is an illustrative view showing a configuration of a control part of the processing apparatus shown in FIG. 4.

The processing apparatus 10 further includes the control part 100 configured to control individual parts of the processing apparatus 10. FIG. 5 shows the configuration of the control part 100. As shown in FIG. 5, the control part 100 includes a main control part 110, an operation panel 121, a temperature sensor (group) 122, a manometer (group) 123, a heater controller 124, a flow rate control part 125 and a valve control part 126. Particularly, the control part 100 controls the gas supply part GF, the heaters 30 and the exhaust device 42.

The operation panel 121, the temperature sensor (group) 122, the manometer (group) 123, the heater controller 124, the flow rate control part 125, the valve control part 126 and so forth are connected to the main control part 110.

The operation panel 121 includes a display screen and operation buttons, and is configured to transmit an operator's operation instruction to the main control part 110. The operation panel 121 is configured to allow the display screen to display various types of information transmitted from the main control part 110.

The temperature sensor (group) 122 is configured to measure internal temperatures of the vessel 12, the gas introduction pipe 32, the exhaust pipe 38 and the like, and reports the measured temperature values to the main control part 110. The manometer (group) 123 is configured to measure internal pressures of the vessel 12, the gas introduction pipe 32, the exhaust pipe 38 and the like, and reports the measured pressure values to the main control part 110.

The heater controller 124 is configured to individually control the heaters 30. In response to the instruction transmitted from the main control part 110, the heater controller 124 is configured to supply electric power to the heaters 30, thereby causing the heaters 30 to generate heat. The heater controller 124 is configured to individually measure power consumption of the heaters 30 and reports the measured power consumption to the main control part 110.

The flow rate control part 125 is configured to control the flow rate controllers FC1 to FC5 of the gas supply part GF such that the flow rates of the gases flowing through the gas introduction pipe 32 are set to become equal to the flow rates instructed by the main control part 110. Moreover, the flow rate control part 125 is configured to measure flow rates of the gases actually flowing through the gas introduction pipe 32 and reports the measured flow rate values to the main control part 110. The valve control part 126 is configured to control opening degrees of the valves according to the values instructed by the main control part 110.

The main control part 110 includes a recipe storage part 111, a ROM 112, a RAM 113, an I/O port 114, a CPU 115, and a bus 116 which interconnects the recipe storage part 111, the ROM 112, the RAM 113, the I/O port 114 and the CPU 115.

A setup recipe and a plurality of process recipes are stored in the recipe storage part 111. The recipe storage part 111 is configured to only store the setup recipe when the processing apparatus 10 is initially manufactured. The setup recipe is executed to generate a thermal model or the like corresponding to different processing apparatuses. The process recipes are prepared for each individual process which is actually performed pursuant to the user's desire. For example, the process recipes define various conditions such as a variation in temperature in the respective areas, a variation in the internal pressure of the vessel 12, the start and stop timing for supplying the gas, the supply amount of the gas, and the like, from the time at which the wafers W are loaded into the vessel 12 to the time at which the processed wafers W are unloaded from the vessel 12.

The ROM 112 is formed of an EEPROM, a flash memory, a hard disk or the like. The ROM 112 is a storage medium for storing an operation program of the CPU 115. The RAM 113 serves as a work area or the like of the CPU 115.

The I/O port 114 is connected to the operation panel 121, the temperature sensor (group) 122, the manometer (group) 123, the heater controller 124, the flow rate control part 125, the valve control part 126 and the like. The I/O port 114 is configured to control the input and output of data or signals.

The CPU 115 is the core of the main control part 110 and executes the control program stored in the ROM 112. In response to the instructions transmitted from the operation panel 121, the CPU 115 generally controls the operation of the processing apparatus 10 depending on the recipes (process recipes) stored in the recipe storage part 111. The CPU 115 controls the temperature sensor (group) 122, the manometer (group) 123, the flow rate control part 125, and the like to respectively measure the temperatures, the pressures and the flow rates, and the like within the vessel 12, the gas introduction pipe 32 and the exhaust pipe 38. Based on the measured data, the CPU 115 outputs control signals and the like to the heater controller 124, the flow rate control part 125, the valve control part 126 and the like and controls the respective parts pursuant to the process recipes. The bus 116 is configured to transmit information between the respective parts.

Figure 2:
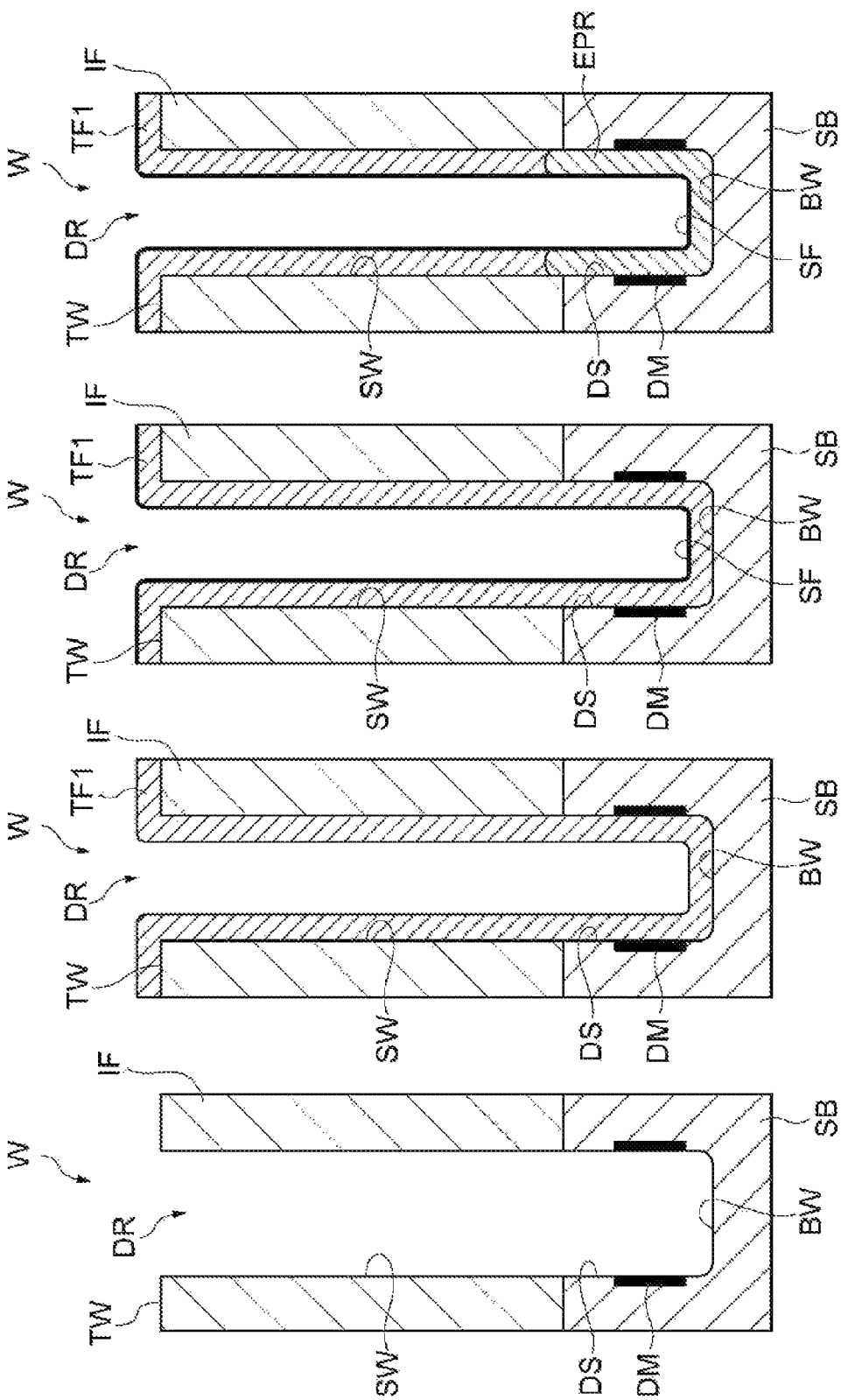
FIGS. 2A to 2D are sectional views illustrating the initial state of a workpiece which is not subjected to the method illustrated in FIG. 1 and the states of a workpiece which has been subjected to respective steps of the method illustrated in FIG. 1.
Figure 3:
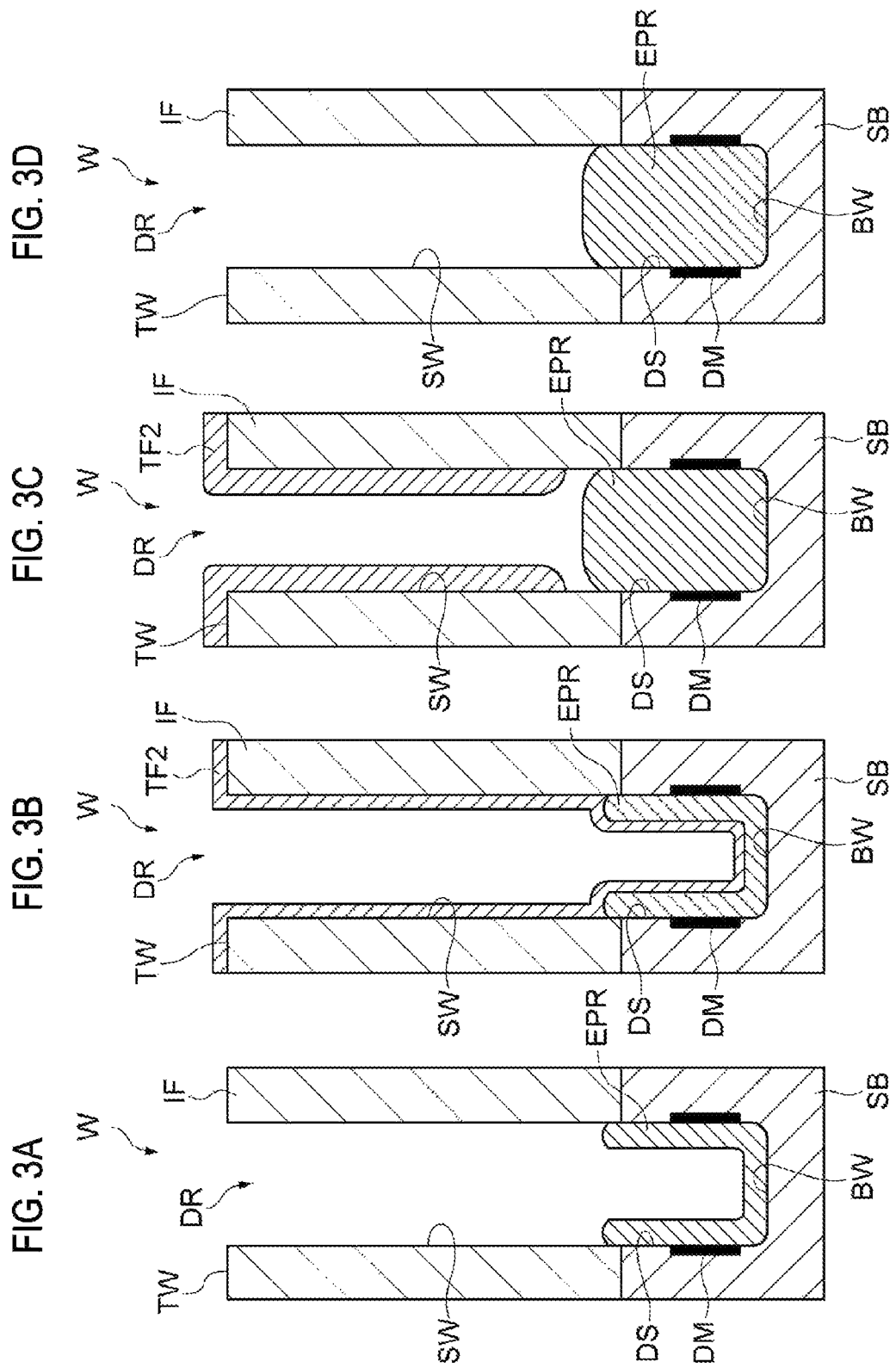
FIGS. 3A to 3D are sectional views illustrating the states of a workpiece which has been subjected to respective steps of the method illustrated in FIG. 1.

Hereinafter, the method MT, which can be implemented by the processing apparatus 10 configured as above, will be described with reference to FIGS. 1 to 3.

In the method MT according to one embodiment, step ST1 illustrated in FIG. 1 is first implemented. At step ST1, as illustrated in FIG. 2B, the first thin film TF1 is formed. The first thin film TF1 may be an amorphous semiconductor film, for example, an amorphous silicon film, an amorphous germanium film or an amorphous silicon-germanium film. In this case, the semiconductor substrate SB may be a monocrystalline semiconductor substrate or a polycrystalline semiconductor substrate, for example, a monocrystalline silicon substrate or a polycrystalline silicon substrate. The first thin film TF1 may be a polycrystalline semiconductor film, for example, a polycrystalline silicon film, a polycrystalline germanium film or a polycrystalline silicon-germanium film. In this case, the semiconductor substrate SB may be a monocrystalline semiconductor substrate, for example, a monocrystalline silicon substrate.

The first thin film TF1 is formed along the wall surfaces which define the depression DR, so as not to close the depression DR. The first thin film TF1 is formed along the side wall surface SW, the bottom surface BW and the top surface TW. The first thin film TF1 may be directly formed on the side wall surface SW, the bottom surface BW and the top surface TW. The first thin film TF1 is formed so as to cover the entire damage region DM formed on the surface DS which defines the depression DR in the semiconductor substrate SB. The thickness of the first thin film TF1 is set to fall within a range of, e.g., about 10 nm to 13 nm. When forming the first thin film TF1 at step ST1, an impurity is not contained in the first thin film TF1.

At step ST1, in order to form the first thin film TF1, the first gas is supplied into the vessel 12 which accommodates the wafers W. The first gas includes a raw material gas, namely a silicon-containing gas, a germanium-containing gas or a mixed gas of a silicon-containing gas and a germanium-containing gas. At step ST1, the internal pressure of the vessel 12 is set at a predetermined pressure, and the internal temperature of the vessel 12 is set at a predetermined temperature. At step ST1, the raw material gas is supplied into the vessel 12 at a flow rate which falls within a range of, e.g., about 50 sccm to 5,000 sccm. At step ST1, the internal pressure of the vessel 12 is set at a pressure which falls within a range of, e.g., about $1.0 \times 10^{-1}$ Torr (13 Pa) to 10 Torr ($1.3 \times 10^3$ Pa). The internal temperature of the vessel 12 is set at a temperature which falls within a range of, e.g., about 300 degrees C. to 700 degrees C.

The first gas may further include an additive gas. The additive gas may include, for example, one or more of a $C_2H_4$ gas, a $N_2O$ gas, a NO gas and a $NH_3$ gas. At step ST1, the flow rate of the additive gas is set at a flow rate which falls within a range of, e.g., about 5 sccm to 1,000 sccm. The first gas does not include an impurity source gas supplied by the gas source GS2.

When step ST1 is implemented by using the processing apparatus 10, the control part 100 executes a control (first control) which will be described below. In the first control, the control part 100 causes the gas supply part GF to supply the first gas into the vessel 12. Specifically, in the first control, the control part 100 controls the valve V11, the flow rate controller FC1 and the valve V12 so that the raw material gas is supplied from the gas source GS1 into the vessel 12 at a predetermined flow rate. The control part 100 controls the exhaust device 42 so that the internal pressure of the vessel 12 is set at a predetermined pressure. The control part 100 controls the heaters 30 so that the internal temperature of the vessel 12 is set at a predetermined temperature. When an additive gas is used at step ST1, the control part 100 may control the valve V31, the flow rate controller FC3 and the valve V32 so that the additive gas is supplied from the gas source GS3 into the vessel 12 at a predetermined flow rate.

At step ST2 illustrated in FIG. 1, which is subsequent to step ST1, gas phase doping is performed with respect to the first thin film TF1. As illustrated in FIG. 2C, an impurity is doped from the surface of the first thin film TF1 and a doping layer SF having a relatively high impurity concentration is formed so as to cover the surface of the first thin film TF1. The impurity does not exist only in the doping layer SF but is diffused into the first thin film TF1 at a concentration lower than the impurity concentration of the doping layer SF. At step ST2, in order to perform the gas phase doping, the third gas is supplied into the vessel 12 which accommodates the wafers W. The third gas is an impurity source gas. Examples of the impurity may include arsenic (As), boron (B) and phosphorus (P). As the impurity source gas, it may be possible to use, for example, phosphine ($PH_3$), diborane ($B_2H_6$), boron trichloride ($BCl_3$) and arsine ($AsH_3$). At step ST2, the flow rate of the impurity source gas is set at a flow rate which falls within a range of, e.g., about 5 sccm to 5,000 sccm. At step ST2, the internal pressure of the vessel 12 is set at a pressure which falls within a range of, e.g., about $1.0\times10^{-1}$ Torr (13 Pa) to 10 Torr ($1.3\times10^3$ Pa). The internal temperature of the vessel 12 is set at a temperature which falls within a range of, e.g., about 300 degrees C. to 700 degrees C.

When step ST2 is implemented by using the processing apparatus 10, the control part 100 executes a control (second control) which will be described below. In the second control, the control part 100 causes the gas supply part GF to supply the third gas into the vessel 12. Specifically, in the second control, the control part 100 controls the valve V21, the flow rate controller FC2 and the valve V22 so that the impurity source gas is supplied from the gas source GS2 into the vessel 12 at a predetermined flow rate. The control part 100 controls the exhaust device 42 so that the internal pressure of the vessel 12 is set at a predetermined pressure. The control part 100 controls the heaters 30 so that the internal temperature of the vessel 12 is set at a predetermined temperature.

At step ST3 illustrated in FIG. 1, which is subsequent to step ST2, an epitaxial region EPR is formed from a portion of the first thin film TF1 as illustrated in FIG. 2D. At step ST3, the wafers W are annealed within the vessel 12. Thus, an epitaxial region conforming to the crystals of the semiconductor substrate SB is formed from the semiconductor material of the first thin film TF1 along the surface of the semiconductor substrate SB which defines the depression DR, without having to move the first thin film TF1 with the gas phase doping performed.

Specifically, an epitaxial region EPR conforming to the crystals of the semiconductor substrate SB is formed by solid phase epitaxial growth from the semiconductor material of the first thin film TF1 with the gas phase doping performed, without having to substantially move the first thin film TF1 whose surface has been subjected to the gas phase doping at step ST2 (while suppressing migration of the first thin film TF1), in a state in which the damage region DM is covered with the first thin film TF1 with the gas phase doping performed. That is to say, an epitaxial region EPR having the same crystal structure as the crystal structure of the semiconductor substrate SB is formed by solid phase epitaxial growth from the semiconductor material of the first thin film TF1 with the gas phase doping performed, so that the epitaxial region EPR defines the depression DR in the semiconductor substrate SB and covers the entirety of the wall surface (the surface DS) and the bottom surface BW including the damage region DM. The epitaxial region EPR extends along the surface DS and the bottom surface BW of the semiconductor substrate SB, which define the depression DR. The epitaxial region EPR contains the impurity supplied from the gas source GS2.

In order to form the epitaxial region EPR, at step ST3, the wafers W are annealed within the vessel 12 set at a first pressure. Specifically, at step ST3, the internal temperature of the vessel 12 which accommodates the wafers W is set at a predetermined temperature. For example, the internal temperature of the vessel 12 is set at a temperature which falls within a range of about 300 degrees C. to 600 degrees C. At step ST3, the internal pressure of the vessel 12 is set at a first pressure. The first pressure may be, e.g., a pressure equal to or higher than $1.0\times10^{-10}$ Torr ($1.3\times10^{-8}$ Pa). The first pressure may be, e.g., a pressure equal to or lower than $7.6\times10^2$ Torr ($1.0\times10^5$ Pa). That is to say, even under a pressure (falling within a range of about $1.0\times10^{-10}$ Torr ($1.3\times10^{-8}$ Pa) to 1.0 Torr ($1.3\times10^2$ Pa)) at which, when the first thin film TF1 is not subjected to the gas phase doping, migration is generated in the first thin film TF1 by annealing and an epitaxial region EPR is not formed along the wall surfaces that define the depression DR in the semiconductor substrate SB, it is possible to suppress migration by performing the gas phase doping on the first thin film TF1, so that an epitaxial region EPR is formed along the wall surfaces that define the depression DR in the semiconductor substrate SB. In addition, at step ST3, an inert gas such as a hydrogen gas or a nitrogen gas may be supplied into the vessel 12.

When step ST3 is implemented using the processing apparatus 10, the control part 100 executes a control (third control) which will be described below. In the third control, the control part 100 causes the heaters 30 to heat the internal space of the vessel 12 after the second control is executed. More specifically, in the third control, the control part 100 causes the exhaust device 42 to set the internal pressure of the vessel 12 at a first pressure after the second control is executed. Furthermore, the control part 100 causes the heaters 30 to heat the internal space of the vessel 12. Specifically, in the third control, the control part 100 controls the exhaust device 42 so that the internal pressure of the vessel 12 is set at a first pressure, and controls the heaters 30 so that the internal temperature of the vessel 12 is set at a predetermined temperature. In the third control, if an inert gas is used, the control part 100 controls the valve V41, the flow rate controller FC4 and the valve V42 so that an inert gas is supplied from the gas source GS4 into the vessel 12 at a predetermined flow rate.

At step ST4 illustrated in FIG. 1, which is subsequent to step ST3, a remaining portion of the first thin film TF1, which is left without constituting the epitaxial region EPR, is etched as illustrated in FIG. 3A. At step ST4, the fourth gas is supplied at a predetermined flow rate into the vessel 12 which accommodates the wafers W. The fourth gas may contain one or more of $Cl_2$, HCl, $F_2$, $Br_2$ and HBr. The flow rate of the fourth gas may be, e.g., a flow rate which falls within a range of about 10 sccm to 5,000 sccm. At step ST4, the internal pressure of the vessel 12 is set at a predetermined pressure, and the internal temperature of the vessel 12 is set at a predetermined temperature. The internal pressure of the vessel 12 at step ST4 may be, e.g., a pressure which falls within a range of about $1.0\times10^{-10}$ Torr ($1.3\times10^{-8}$ Pa) to $1.0\times10^2$ Torr ($1.3\times10^4$ Pa). The internal temperature of the vessel 12 at step ST4 may be, e.g., a temperature which falls within a range of about 200 degrees C. to 700 degrees C. The etching rate of the first thin film TF1 by the fourth gas is higher than the etching rate of the epitaxial region EPR by the fourth gas. Accordingly, as a result of step ST4, as illustrated in FIG. 3A, it is possible to selectively remove the first thin film TF1 while leaving the epitaxial region EPR.

When step ST4 is implemented using the processing apparatus 10, the control part 100 executes the control (sixth control) which will be described below. In the sixth control, the control part 100 causes the gas supply part GF to supply the fourth gas into the vessel 12 during a time period between the execution of the third control and the execution of the fourth control which will be described later. Specifically, in the sixth control, the control part 100 controls the valve v51, the flow rate controller FC5 and the valve V52 so that the fourth gas is supplied from the gas source GS5 into the vessel 12 at a predetermined flow rate. The control part 100 controls the exhaust device 42 so that the internal pressure of the vessel 12 is set at a predetermined pressure. The control part 100 controls the heaters 30 so that the internal temperature of the vessel 12 is set at a predetermined temperature.

The first thin film TF1 and the epitaxial region EPR at step ST4 contain the impurity supplied from the gas source GS2 at similar concentrations by the gas phase doping performed at step ST2. The remaining portion of the first thin film TF1 existing on the side wall surface SW may include a polycrystalline region due to the annealing performed at step ST3. Although the remaining portion of the first thin film TF1 includes the polycrystalline region, since an etching rate of the polycrystalline region is higher than that of the epitaxial region EPR, it is possible to selectively remove the remaining portion of the first thin film TF1 including the polycrystalline region by the etching performed at step ST4 while leaving the epitaxial region EPR.

At step ST5 illustrated in FIG. 1, which is subsequent to step ST4, the second thin film TF2 is formed as illustrated in FIG. 3B. The second thin film TF2 may be an amorphous semiconductor film, for example, an amorphous silicon film, an amorphous germanium film or an amorphous silicon-germanium film. In this case, the semiconductor substrate SB may be a monocrystalline semiconductor substrate or a polycrystalline semiconductor substrate, for example, a monocrystalline silicon substrate or a polycrystalline silicon substrate. Furthermore, the second thin film TF2 may be a polycrystalline semiconductor film, for example, a polycrystalline silicon film, a polycrystalline germanium film or a polycrystalline silicon germanium film. In this case, the semiconductor substrate SB may be a monocrystalline semiconductor substrate, for example, a monocrystalline silicon substrate. The second thin film TF2 is formed along the surfaces which define the depression DR, so as not to occlude the depression DR. The thickness of the second thin film TF2 is set at a thickness of, e.g., about 10 nm to 13 nm. The processing for the formation of the second thin film TF2 performed at step ST5 is similar to the processing for the formation of the first thin film TF1 performed at step ST1. The second gas similar to the first gas is used. When step ST5 is implemented using the processing apparatus 10, the control part 100 executes the fourth control similar to the first control described above. In the fourth control, the control part 100 causes the gas supply part GF to supply the second gas into the vessel 12 after the sixth control is executed.

The second thin film TF2 may contain an impurity. The impurity contained in the second thin film TF2 is supplied by the gas source GS2. Examples of the impurity may include arsenic (As), boron (B) and phosphorus (P). As the impurity source gas, it may be possible to use, for example, phosphine (PH$_3$), diborane (B$_2$H$_6$), boron trichloride (BCl$_3$) and arsine (AsH$_3$). In this case, the second gas further includes an impurity source gas at step ST5. At step ST5, the flow rate of the impurity source gas may be, e.g., a flow rate which falls within a range of about 5 sccm to 5,000 sccm. The control part 100 may control the valve V21, the flow rate controller FC2 and the valve V22 so that the impurity source gas is supplied from the gas source GS2 into the vessel 12 at a predetermined flow rate.

At step ST6 illustrated in FIG. 1, which is subsequent to step ST5, an epitaxial region EPR is further formed from the semiconductor material of the second thin film TF2 as illustrated in FIG. 3C. At step ST6, by annealing the wafers W within the vessel 12, an epitaxial region is further formed from the semiconductor material of the second thin film TF2 moved toward the bottom of the depression DR. Specifically, at step ST6, migration is generated such that the semiconductor material of the second thin film TF2 is moved toward the bottom of the depression DR. Thus, an epitaxial region is further grown by solid phase epitaxial growth such that the moved semiconductor material has the same crystal structure as the crystal structure of the existing epitaxial region EPR. This expands the epitaxial region EPR in the depression DR.

At step ST6, the wafers W are annealed within the vessel 12 set at a second pressure. Specifically, at step ST6, the internal temperature of the vessel 12 which accommodates the wafers W is set at a predetermined temperature. For example, the internal temperature of the vessel 12 is set at a temperature which falls within a range of about 300 degrees C. to 600 degrees C. At step ST6, the internal pressure of the vessel 12 is set at a second pressure. The second pressure may be, e.g., a pressure equal to or higher than $1.0 \times 10^{-10}$ Torr ($1.3 \times 10^{-8}$ Pa). The second pressure may be, e.g., a pressure equal to or lower than 1.0 Torr ($1.3 \times 10^{2}$ Pa). In this way, the range of the second pressure may be included within the range of the first pressure. Furthermore, at step ST6, an inert gas such as a hydrogen gas or a nitrogen gas may be supplied into the vessel 12.

When step ST6 is implemented using the processing apparatus 10, the control part 100 executes a control (a fifth control) which will be described below. In the fifth control, the control part 100 causes the heaters 30 to heat the internal space of the vessel 12 after the fourth control is executed. More specifically, in the fifth control, after the fourth control is executed, the control part 100 causes the exhaust device 42 to set the internal pressure of the vessel 12 at a second pressure and causes the heaters 30 to heat the internal space of the vessel 12. Specifically, in the fifth control, the control part 100 controls the exhaust device 42 so that the internal pressure of the vessel 12 is set at a second pressure, and controls the heaters 30 so that the internal temperature of the vessel 12 is set at a predetermined temperature. In the case of using an inert gas, the control part 100 controls the valve V41, the flow rate controller FC4 and the valve V42 so that an inert gas is supplied from the gas source GS4 into the vessel 12 at a predetermined flow rate.

At step ST7 illustrated in FIG. 1, which is subsequent to step ST6, a remaining portion of the second thin film TF2, which is left without constituting the epitaxial region EPR, is etched as illustrated in FIG. 3D. At step ST7, the fifth gas is supplied at a predetermined flow rate into the vessel 12 which accommodates the wafers W. The fifth gas is similar to the fourth gas used at step ST4 and may contain one or more of Cl$_2$, HCl, F$_2$, Br$_2$ and HBr. The flow rate of the fifth gas may be, e.g., a flow rate which falls within a range of about 10 sccm to 5,000 sccm. At step ST7, the internal pressure of the vessel 12 is set at a predetermined pressure and the internal temperature of the vessel 12 is set at a predetermined temperature. The internal pressure of the vessel 12 at step ST7 may be, e.g., a pressure which falls within a range of about $1.0 \times 10^{-10}$ Torr ($1.3 \times 10^{-8}$ Pa) to $1.0 \times 10^{2}$ Torr ($1.3 \times 10^{4}$ Pa). The internal temperature of the vessel 12 at step ST7 may be, e.g., a temperature which falls within a range of about 200 degrees C. to 700 degrees C. The etching rate of the second thin film TF2 by the fifth gas is higher than the etching rate of the epitaxial region EPR by the fifth gas. Accordingly, as a result of step ST7, as illustrated in FIG. 3D, it is possible to selectively remove the second thin film TF2 while leaving the epitaxial region EPR.

When step ST7 is implemented by the processing apparatus 10, the control part 100 executes a control (a seventh control) which will be described below. In the seventh control, the control part 100 causes the gas supply part GF to supply the fifth gas into the vessel 12 after the fifth control is executed. Specifically, in the seventh control, the control part 100 controls the valve V51, the flow rate controller FC5 and the valve V52 so that the fifth gas is supplied from the gas source GS5 into the vessel 12 at a predetermined flow rate. The control part 100 controls the exhaust device 42 so that the internal pressure of the vessel 12 is set at a predetermined pressure. The control part 100 controls the heaters 30 so that the internal temperature of the vessel 12 is set at a predetermined temperature.

Further, when the second gas includes the impurity source gas at step ST5, the impurity supplied from the gas source GS2 is contained at similar concentrations in the second thin film TF2 and the epitaxial region EPR used at step ST7. The remaining portion of the second thin film TF2 existing on the side wall surface SW may include a polycrystalline region due to the annealing performed at step ST6. Although the remaining portion of the first thin film TF2 includes the polycrystalline region, since an etching rate of the polycrystalline region is higher than that of the epitaxial region EPR, it is possible to selectively remove the remainder of the second thin film TF2 including the polycrystalline region by the etching performed at step ST7 while leaving the epitaxial region EPR.

At step STa illustrated in FIG. 1, which is subsequent to step ST7, a determination is made as to whether a termination condition is satisfied. When the number of repetitions of the sequence SQ, including steps ST5, ST6 and ST7, reaches a predetermined number, it is determined that the termination condition is satisfied. The predetermined number of times is one or more. If it is determined at step STa that the termination condition is not satisfied, the sequence SQ is implemented again. On the other hand, if it is determined at step STa that the termination condition is satisfied, the method MT is terminated.

At step ST2, since the gas phase doping is performed on the surface of the first thin film TF1 which covers the surface DS including the damage region DM, even if the annealing of step ST3 is performed at a relatively low pressure (e.g., a pressure at which migration is generated in the first thin film TF1 when the gas phase doping is not performed on the first thin film TF1), the migration of the semiconductor material which constitutes the first thin film TF1 is suppressed. Thus, the semiconductor material is not substantially moved and is crystallized while covering the damage region DM. Accordingly, even if a region in which the epitaxial growth cannot be caused, such as a damage region DM, exists on the surface DS that defines the depression DR in the semiconductor substrate SB, it is possible to form an epitaxial region EPR along the surface DS so as to cover such a region. It is therefore possible to fill the depression DR in the epitaxial region EPR without generating cavities. This makes it possible to suppress generation of cavities in the epitaxial region filled into the depression DR.

According to the processing apparatus 10 described above, the control part 100 controls the processing apparatus 10 such that the first gas for the formation of the first thin film TF1 is supplied into the vessel 12 and then the third gas for use in gas phase doping is supplied into the vessel 12, thereby performing the gas phase doping. Thereafter, since the vessel 12 is heated, the generation of migration in the semiconductor material of the first thin film TF1 existing within the vessel 12 is suppressed by the doping layer SF formed on the first thin film TF1 by the gas phase doping. It is therefore possible to form the epitaxial region from the semiconductor material of the first thin film TF1 without substantially moving the first thin film TF1. Particularly, even when a region in which the epitaxial growth cannot be caused from the first thin film TF1 and a region in which the epitaxial growth cannot be caused (the damage region DM) are included in the surfaces (the side wall surface SW and the bottom surface BW that define the depression DR) on which the first thin film TF1 is formed, if the two regions are covered by the first thin film TF1, the generation of migration in the semiconductor material of the first thin film TF1 is suppressed by the doping layer SF formed on the first thin film TF1 by the gas phase doping. Thus, an epitaxial region can be formed from the semiconductor material of the first thin film TF1 even on the region in which the epitaxial growth cannot be caused (regardless of the presence or absence of the region in which the epitaxial growth cannot be caused).

Furthermore, even when the first pressure used in the third control is a pressure which falls within a relatively wide range including the second pressure used in the fifth control, at which migration is generated in the semiconductor material when annealing is performed before performing gas phase doping, since the gas phase doping is performed on the first thin film TF1 before the annealing, it is possible to suppress the generation of migration in the semiconductor material of the first thin film TF1 during the annealing.

Furthermore, according to the method MT described above, since the first thin film TF1 is annealed after the gas phase doping is performed thereupon, the generation of migration in the semiconductor material of the first thin film TF1 is suppressed by the doping layer SF formed on the surface of the first thin film TF1 by the gas phase doping. Accordingly, the epitaxial region EPR conforming to the crystals of the semiconductor substrate SB can be formed from the semiconductor material of the first thin film TF1 along the wall surfaces (the side wall surface SW and the bottom surface BW) of the semiconductor substrate SB, which define the depression DR, without substantially moving the first thin film TF1. Particularly, even when a region in which the epitaxial growth can be caused from the first thin film and a region in which the epitaxial growth cannot be caused (the damage region DM) are included in the surfaces (the side wall surface SW and the bottom surface BW that define the depression DR) on which the first thin film TF1 is formed, if the two regions are covered by the first thin film TF1, the generation of migration in the semiconductor material of the first thin film TF1 is suppressed by the doping layer SF formed on the first thin film TF1 by the gas phase doping. Thus, an epitaxial region can be formed from the semiconductor material of the first thin film TF1 even on the region in which the epitaxial growth cannot be caused (regardless of the presence or absence of the region in which the epitaxial growth cannot be caused).

Furthermore, even when the first pressure used in at step ST3 is a pressure which falls within a relatively wide range including the second pressure used at step ST6, at which migration is generated in the semiconductor material when annealing is performed before performing gas phase doping, since the gas phase doping is performed on the first thin film TF1 before the annealing, it is possible to suppress the generation of migration in the semiconductor material of the first thin film TF1 during the annealing.

While the principle of the present disclosure has been shown and described above based on the above described embodiments, it will be understood by those skilled in the art that the arrangement and details of the present disclosure may be changed without departing from the principle of the present disclosure. The present disclosure is not limited to the specific configurations disclosed in the above described embodiments. Protection is sought for all the modifications and changes derived from the claims and the spirit thereof.

The depression filling method and the processing apparatus according to the present disclosure can be used to suppress the formation of cavities within a depression, for example, when a depression such as a hole or a trench formed on the surface of a semiconductor wafer is filled by epitaxial growth of a semiconductor.

According to the present disclosure in some embodiments, it is possible to suppress the formation of cavities in the technique of filling the depression by the epitaxial growth of the semiconductor material.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of filling a depression of a workpiece which includes a semiconductor substrate and an insulating film formed on the semiconductor substrate, the depression passing through the insulating film and extending up to an inside of the semiconductor substrate, the method comprising:
    forming a first thin film made of a semiconductor material along a wall surface which defines the depression;
    performing gas phase doping on the first thin film;
    by annealing the workpiece within a vessel, forming an epitaxial region conforming to crystals of the semiconductor substrate from the semiconductor material of the first thin film along a surface of the semiconductor substrate which defines the depression, without moving the first thin film with the gas phase doping performed;
    forming a second thin film made of a semiconductor material along the wall surface which defines the depression; and
    by annealing the workpiece within the vessel, further forming an epitaxial region from the semiconductor material of the second thin film moved toward a bottom of the depression.

2. The method of claim 1, wherein the forming the epitaxial region includes annealing the workpiece within the vessel set at a first pressure, and the further forming the epitaxial region includes annealing the workpiece within the vessel set at a second pressure, and
    wherein a range of the first pressure includes a range of the second pressure.

3. The method of claim 2, wherein the first pressure is a pressure equal to or higher than $1.3 \times 10^{-8}$ Pa and equal to or lower than $1.0 \times 10^5$ Pa, and the second pressure is a pressure equal to or higher than $1.3 \times 10^{-8}$ Pa and equal to or lower than $1.3 \times 10^2$ Pa.

4. The method of claim 1, further comprising:
    etching the first thin film between the forming the epitaxial region and the forming the second thin film.

5. The method of claim 1, further comprising:
    etching the second thin film after the further forming the epitaxial region.

* * * * *